United States Patent
Kobayashi et al.

(10) Patent No.: US 7,875,884 B2
(45) Date of Patent: Jan. 25, 2011

(54) HETERO-CRYSTALLINE STRUCTURE AND METHOD OF MAKING SAME

(75) Inventors: Nobuhiko Kobayashi, Sunnyvale, CA (US); Shih Yuan Wang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/555,186

(22) Filed: Sep. 8, 2009

(65) Prior Publication Data

US 2009/0321715 A1    Dec. 31, 2009

Related U.S. Application Data

(62) Division of application No. 11/681,080, filed on Mar. 1, 2007, now Pat. No. 7,608,530.

(51) Int. Cl.
*H01L 31/036* (2006.01)

(52) U.S. Cl. .......... 257/51; 257/64; 257/E29.003; 438/489; 977/790; 977/825

(58) Field of Classification Search .......... 257/51, 257/64, 12, E29.003; 438/489; 977/790, 977/825
See application file for complete search history.

(56) References Cited

U.S. PATENT DOCUMENTS

| 6,249,010 | B1 | 6/2001 | Bergemont | |
|---|---|---|---|---|
| 2003/0126742 | A1* | 7/2003 | Ting et al. | 29/874 |
| 2005/0009224 | A1 | 1/2005 | Yang | |
| 2006/0019472 | A1 | 1/2006 | Pan | |
| 2006/0030132 | A1 | 2/2006 | Van Gestel | |
| 2006/0207647 | A1 | 9/2006 | Tsakalakos et al. | |
| 2006/0281321 | A1 | 12/2006 | Conley, Jr. et al. | |
| 2007/0105356 | A1 | 5/2007 | Wu | |
| 2007/0221840 | A1* | 9/2007 | Cohen et al. | 250/306 |
| 2007/0257264 | A1 | 11/2007 | Hersee | |
| 2008/0173971 | A1 | 7/2008 | Sharma et al. | |
| 2008/0210936 | A1 | 9/2008 | Kobayashi et al. | |
| 2008/0241755 | A1 | 10/2008 | Franklin | |
| 2009/0266974 | A1 | 10/2009 | Verhulst et al. | |

OTHER PUBLICATIONS

Mark S. Gudiksen et al., Size-Dependent Photoluminescence from Single Indium Phosphide Nanowires, J. Phys. Chem. B. 106 (2002) pp. 4036-4039.
Sreeram Vaddiraju et al., Mechanisms of 1D Crystal Growth in Reactive Vapor Transport: Indium Nitride Nanowires, Nano Letters, vol. 5 No. 8 (2005) pp. 1625-1631.
Pu Xian Gao et al., Three-dimensional Interconnected Nanowire Networks of ZnO, Chem. Phys. Letters, 408 (2005) pp. 174-178.
Wen-Ting Chiou et al., Growth of Single Crystal ZnO Nanowires using Sputter Deposition, Diamond and Related Materials, 12 (2003) pp. 1841-1844.

* cited by examiner

*Primary Examiner*—Tu-Tu V Ho

(57) ABSTRACT

A hetero-crystalline device structure and a method of making the same include a first layer and a nanostructure integral to a crystallite in the first layer. The first layer is a non-single crystalline material. The nanostructure is a single crystalline material. The nanostructure is grown on the first layer integral to the crystallite using epitaxial growth.

19 Claims, 2 Drawing Sheets

HETERO-CRYSTALLINE STRUCTURE AND METHOD OF MAKING SAME

CROSS-REFERENCE TO RELATED APPLICATION

The present application is a divisional application of application Ser. No. 11/681,080, filed Mar. 1, 2007, now U.S. Pat. No. 7,608,530 the contents of which are incorporated herein in its entirety.

STATEMENT REGARDING FEDERALLY SPONSORED RESEARCH OR DEVELOPMENT

N/A

BACKGROUND

1. Technical Field

The invention relates to nanotechnology. In particular, the invention relates to integrating a single crystalline semiconductor nanostructure with a non-single crystalline layer to form a hetero-crystalline device structure.

2. Description of Related Art

Historically, high performance semiconductor devices, especially those with p-n junctions, comprise single crystals of one or more semiconductor materials. Among other things, using such single crystalline materials for semiconductor devices essentially eliminates the scattering of charged carriers (e.g., holes and electrons) at grain boundaries that exist in non-single crystalline semiconductor materials such as polycrystalline semiconductor materials. Such scattering adversely reduces the drift mobility and the diffusion of charged carriers, and leads to a degraded performance (e.g., increased resistance) of devices, such as transistors and solar cells. Even when different semiconductor materials were employed together in a single device, such as in a heterostructure or heterojunction device, single crystalline semiconductor materials are generally chosen based on their respective lattice structures to insure that the structure realized is an essentially single crystalline structure as a whole. Similarly, nanostructures including, but not limited to, nanowires and nanodots are typically nucleated and grown from single crystalline substrates, in part to capitalize on the uniform nature of the lattice of such substrates that provides required crystallographic information for the nanostructures to be grown as single crystals.

Relatively recently, amorphous and other essentially non-single crystalline semiconductor materials have begun to attract attention, in particular, in solar cell applications. While having the disadvantages associated with multiple grain boundaries, such non-single crystalline semiconductor materials can be considerably cheaper to manufacture than their single crystalline counterparts. In many applications, the lower cost of producing the semiconductor device from non-single crystalline materials outweighs any loss of performance that may result. Furthermore, using non-single crystalline semiconductor materials for heterostructures can increase the possible combinations of materials that can be used since lattice mismatch is less of a concern with non-single crystalline semiconductors.

For example, heavily doped polycrystalline silicon (Si) is commonly used instead of or in addition to metal for conductor traces in integrated circuits where the heavy doping essentially overcomes the increased resistivity associated with carrier scattering from the multiple grain boundaries. Similarly, polycrystalline Si is commonly used in solar cells where its relatively lower cost outweighs the decrease in performance associated with the nature of the polycrystalline material. Amorphous semiconductor material is similarly finding applications in solar cells and in thin film transistors (TFTs) for various optical display applications where cost generally dominates over concerns about performance. Unfortunately, the ability to effectively combine non-single crystalline materials with single crystalline semiconductor materials to realize semiconductor junction-based devices and heterostructure or heterojunction devices has generally met with little success, in part, due to the disruptive effects that joining a single crystalline layer to a non-single crystalline layer has on the physical properties of the single crystalline layer.

BRIEF SUMMARY

In some embodiments of the present invention, a method of making a hetero-crystalline structure is provided. The method of making comprises forming a first layer of a non-single crystalline material. The method of making further comprises growing a nanostructure of a single crystalline material on the first layer integral to a crystallite in the first layer. The nanostructure is grown using catalyst-free epitaxial growth.

In other embodiments of the present invention, a method of making a hetero-crystalline device structure is provided. The method of making comprises forming a first layer of a non-single crystalline material. The method of making further comprises depositing a mask layer on a surface of the first layer and patterning the mask layer to expose a discrete portion of the first layer surface through an opening in the mask layer. The discrete portion corresponds to a crystallite in the first layer. The method of making further comprises growing a nanostructure of a single-crystalline material in the opening integral to a crystallite in the first layer using selective epitaxial growth.

In other embodiments of the present invention, a hetero-crystalline structure is provided. The hetero-crystalline structure comprises a first layer of a non-single crystalline material; and a nanostructure of a single-crystalline material on the first layer. The nanostructure is integral to a crystallite in the first layer.

Certain embodiments of the present invention have other features that are one or both of in addition to and in lieu of the features described hereinabove. These and other features of some embodiments of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Figure 1:
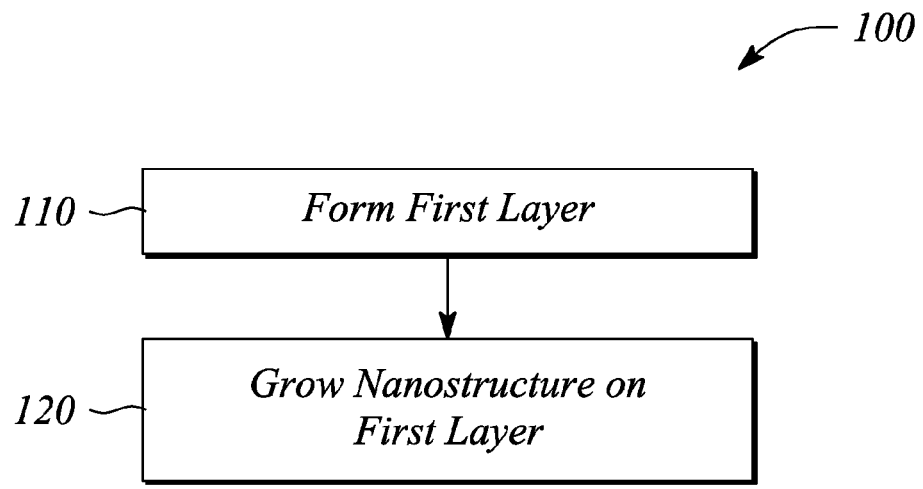
FIG. 1 illustrates a flow chart of a method of making a hetero-crystalline structure according to an embodiment of the present invention.

Embodiments of the present invention facilitate and provide a hetero-crystalline structure. A hetero-crystalline structure is defined herein as a device structure that comprises a non-single crystalline layer and a single crystalline nanostructure that is integral to (i.e., nucleated and grown from) the non-single crystalline layer. In particular, individual nanostructures are associated with short-range atomic ordering of the non-single crystalline layer. Crystallographic information associated with the short-range atomic ordering is transferred to the nanostructure during growth of the nanostructure. The integral crystal-structure connection at the interface between the non-single crystalline layer and the single crystalline nanostructure, when the single crystalline nanostructure is made of a semiconductor material, facilitates using the interface for a variety of semiconductor junction-related applications including, but not limited to, optoelectronic devices (e.g., photodetectors, LEDs, lasers and solar cells) and electronic devices (e.g., diodes and transistors). In other embodiments, the hetero-crystalline device structure comprises single crystalline nanostructures made of non-linear optical materials. The non-single crystalline layer provides electrical signals to the single crystalline nanostructures and activates the single crystalline nanostructure for a variety of applications including, but not limited to, optoelectronic devices (e.g. optical modulators).

According to some embodiments, the hetero-crystalline device structure comprises a semiconductor junction provided by selective doping within or between the layers or structures. In some embodiments, the hetero-crystalline device structure comprises a p-n junction or a p-i-n junction. For example, a p-n junction may be formed when the nanostructure is a semiconductor material that is doped with an n-type dopant and when the non-single crystalline layer is a semiconductor material doped with a p-type dopant. In another example, a p-n junction is formed entirely within the nanostructure when the nanostructure is a semiconductor material. In this example, the non-single crystalline layer may be one of a semiconductor material, a metal material or a metal alloy material. In other embodiments, an intrinsic layer is formed between a p-region and an n-region to yield a p-i-n junction within the hetero-crystalline device structure. For example, a portion of the nanostructure may be n-doped while another portion thereof is essentially undoped (e.g., intrinsic) and the non-single crystalline layer is a p-doped semiconductor material. In other embodiments, multiple p-n junctions, p-i-n junctions and combinations thereof are formed in or between the nanostructure(s) and the non-single crystalline semiconductor layer(s). For simplicity of discussion and not by way of limitation, the term 'p-n junction' means herein one or both of the p-n junction and the p-i-n junction unless explicit distinction is necessary for proper understanding.

In some embodiments, the hetero-crystalline device structure comprises a Schottky junction that is provided when the nanostructure is one of a lightly doped semiconductor or a metal (including a metal alloy) and the non-single crystalline layer is conversely one of a metal (including a metal alloy) or a lightly doped semiconductor. For example, a Schottky junction may be formed between the nanostructure and the non-single crystalline layer when the nanostructure is a lightly doped semiconductor (with either a p-type dopant or an n-type dopant) and when the non-single crystalline layer is a metal material or a metal alloy material.

In some embodiments, the hetero-crystalline device structure comprises a ohmic junction that is provided when the nanostructure is one of a heavily doped semiconductor or a metal (including a metal alloy) and the non-single crystalline layer is conversely one of a metal (including a metal alloy) or a heavily doped semiconductor. For example, an ohmic junction may be formed between the nanostructure and the non-single crystalline layer when the nanostructure is a heavily doped semiconductor (with either a p-type dopant ($p^+$) or an n-type dopant ($n^+$)) and when the non-single crystalline layer is a metal material or a metal alloy material. An ohmic junction is useful in devices including, but not limited to, photoconductors. In other embodiments, the hetero-crystalline device structure comprises one or more of a p-n junction, a Schottky junction and an ohmic junction that is located one or more of in the nanostructure, in the non-single crystalline layer and between the nanostructure and the non-single crystalline layer.

Further, according to various embodiments, the hetero-crystalline structure may comprise a heterostructure or a heterojunction semiconductor device. For example, semiconductor materials having differing band gaps are employed to respectively realize the nanostructure and the non-single crystalline layer of some hetero-crystalline semiconductor device embodiments of the present invention. The hetero-crystalline semiconductor device that comprises such differing materials is termed a heterostructure hetero-crystalline semiconductor device.

Herein, a non-single crystalline material is defined as having short range atomic ordering and as such, the material lacks long-range atomic ordering. In contrast, as used herein, a single crystalline material has a crystal lattice that is essentially continuous in micrometer scale, as generally defined for a single crystal. In some embodiments, the short range atomic ordering ranges in extent from 1 nanometer to about 100 microns. The short range atomic ordering manifests as multiple, small regions of crystalline material or crystallites dispersed within and generally throughout the non-single crystalline material. The regions of crystallites may range from clusters or groups of individual crystallites to discrete individual crystallites. Thus, the non-single crystalline material comprises multiple crystallites buried in a non-single crystalline matrix. The crystallites in the non-single crystalline material essentially define the short range atomic ordering.

The term 'hetero-crystalline' is defined herein as a structure comprising at least two different types of structural phases. In particular, herein a hetero-crystalline structure comprises at least a non-single crystalline material having crystallites and a single crystalline material that is integral to a crystallite of the non-single crystalline material.

With respect to the various embodiments of the present invention, the non-single crystalline material having short-range atomic ordering provides a template for nucleation and growth of a single crystalline nanometer-scale structure (i.e., 'nanostructure'). In particular, a crystallite of the non-single crystalline material layer provides a nucleation site for growth of a nanostructure. The nucleation site includes within its scope, but is not limited to, growing one or more nanostructures either from a single crystallite or from an aggregate or cluster of crystallites, depending on the size of crystallites. For example, if the size of a single crystallite is large compared to the size of a nanostructure, more than one nanostructure may grow from the single crystallite. On the other hand, if the size of a single crystallite is small compared to the size of the nanostructure, but many such crystallites aggregate to form a large crystallite area, then a single nanostructure, or even multiple nanostructures, can grow from such a group of crystallites. As used herein, the term 'crystallite' means a range of crystallites from a single crystallite to a group of crystallites aggregated together for the purposes of the various embodiments of the present invention. The grown nanostructure forms an interface with the crystallite where the nanostructure is connected to the crystallite commensurately. As such, the nanostructure is said to be integral to a crystallite of the non-single crystalline material.

A non-single crystalline material includes, but is not limited to, one of an electrical insulator, a semiconductor, and an electrical conductor. In some embodiments, the material of the non-single crystalline layer is a semiconductor that includes one or more of a semiconductor, a compound semiconductor and a semiconductor alloy. The semiconductor materials include, but are not limited to, one or more semiconductors from Group IV, a compound semiconductor selected from Group III-V and a compound semiconductor selected from Group II-VI, in some embodiments. In some embodiments, the material of the non-single crystalline layer is an electrical conductor, including one or more of a metal, a metal alloy and a metal compound. In some embodiments, the material of non-single crystalline layer is an insulator material including, but not limited to, one or more of an oxide, a nitride and a carbide of a semiconductor or a metal (e.g., silicon dioxide, quartz and alumina). In some embodiments, the material used herein for the non-single crystalline layer on which the single crystalline nanostructure is integrally grown from a crystallite thereof is a non-insulator material. A non-insulator material has inherent non-insulative character and therefore, is inherently electrically conductive (i.e., a semiconductor material or an electrical conductor material). In contrast to non-insulator materials, an insulator material is inherently insulative and therefore, is not inherently electrically conductive.

A single crystalline material includes, but is not limited to, one of an electrical insulator, a semiconductor, an electrical conductor and a non-linear optical material. For the purposes of the various embodiments of the present invention herein, a material that falls into any of these categories of the single crystalline material is useful as the single crystalline material of the nanostructure. In some embodiments, the single crystalline nanostructure material includes, but is not limited to, one of a semiconductor and an alloy thereof, a metal and an alloy thereof, a metal compound (e.g., an oxide, a nitride, and a carbide of a metal), and a non-metal compound, including any of those described above for non-single crystalline materials. In some embodiments, the single crystalline nanostructure material is a non-linear optical material including, but not limited to, lithium niobate ($LiNbO_3$). Non-linear optical materials are useful in optoelectronics and optics applications, for example.

In some embodiments, the nanostructure comprises a nanowire. A nanowire is an individual quasi-one dimensional, nano-scale, single crystalline structure typically characterized as having two spatial dimensions or directions that are much less than a third spatial dimension or direction. The presence of the third, greater dimension in nanowires facilitates electron wave functions along that dimension while conduction is quantized in the other two spatial dimensions. A nanowire may be referred to as a nanowhisker or a nanoneedle. As used herein, the term nanowire is defined as a nano-scale single crystalline structure, as described above, having an axial length (as a major or third spatial dimension), opposite ends and a solid core. In some embodiments, the nanostructure comprises a nanotube that is characterized as having two spatial dimensions or directions that are much less than a third spatial dimension or direction. A nanotube is defined as a nano-scale single crystalline structure having an axial length (as a major or third spatial dimension), opposite ends and, in contrast to a nanowire, has a hollow core. In other embodiments, the nanostructure comprises a nanodot (i.e., a quantum dot (QD)). A nanodot is a single crystalline, quasi zero-dimensional nanostructure that is nanometer-scale (i.e., nano-scale) in all three spatial dimensions or directions and electron wave functions in the nanodot is quantized in all three spatial dimensions.

Each of the above-mentioned nanostructures may be nucleated and grown from materials having short range atomic ordering, i.e., the non-single crystalline layer, according to the various embodiments herein. As such, a wide variety of materials are available to manufacture the hetero-crystalline device structure embodiments of the present invention. The wide variety of available materials may provide a plethora of potential device applications. For example, a hetero-crystalline semiconductor device according to various embodiments herein include, but are not limited to, a solar cell, a laser, a photodetector, a light emitting diode (LED), a transistor and a diode.

In addition, using a wide variety of non-single crystalline materials may provide cost and manufacturing advantages as well as performance advantages to the hetero-crystalline device structure according to some embodiments. For example, a solar cell device that can be manufactured using non-single crystalline semiconductor materials may be one or both of more cost-effective to make and more efficient compared to conventional solar cells based on single crystalline silicon, according to some embodiments, simply due to the fact that expensive single crystal substrates are not necessary and a broader range of materials that are available for solar cell structures. Material and relevant manufacturing costs for non-single crystalline semiconductor materials are generally cheaper than those for single crystalline semiconductor materials. Moreover, the greater variety of these available materials may provide for energy conversion from more of the solar spectrum than previously available, which may improve solar cell efficiency according to some embodiments. In addition, some of the hetero-crystalline device embodiments of the present invention provide for smaller or more compact construction.

For the purposes of the various embodiments herein, the article 'a' or 'an' is intended to have its ordinary meaning in the patent arts, namely 'one or more'. For example, 'a nanostructure' means 'one or more nanostructures' and as such, 'the nanostructure' means 'the nanostructure(s)' herein. Likewise, 'a crystallite' means 'one or more crystallites', and includes within its scope 'a group of crystallites', as defined above. Moreover, it is irrelevant whether a particular layer is described herein as being on a top or upper side, a bottom or lower side, or on a left side or a right side of other layers of the hetero-crystalline device structure. Therefore, any reference herein to 'top', 'bottom', 'upper', 'lower', 'left' or 'right' with respect to the layers is not intended to be a limitation herein. Examples described herein are provided for illustrative purposes only and not by way of limitation.

In an embodiment of the present invention, a method of making a hetero-crystalline structure is provided. FIG. 1 illustrates a flow chart of a method 100 of making a hetero-crystalline structure according to an embodiment of the present invention. The method 100 of making the hetero-crystalline structure comprises forming 110 a first layer of a non-single crystalline material on a surface of a substrate. The non-single crystalline material of the first layer is any of the materials described above for the non-single crystalline material. In some embodiments, the non-single crystalline material of the first layer is a non-insulator material that is inherently electrically conductive, as defined above. In some embodiments, the non-single crystalline material is selected from one of a metal, a metal alloy and a metal compound. The method 100 of making further comprises growing 120 a nanostructure of a single-crystalline material on the first layer, such that the nanostructure is integral to a crystallite in the first layer. The single crystalline nanostructure material is any of the materials listed above for single crystalline materials. The nanostructure is grown 120 using a catalyst-free epitaxial growth. In accordance with that defined above, by 'integral to a crystallite' it is meant that the nanostructure connects to and obtains necessary crystallographic information from the crystallite that is present in the first layer. The hetero-crystalline structure that is made by the method 100 comprises the integrally connected non-single crystalline first layer and the single crystalline nanostructure.

In some embodiments, forming 110 a first layer comprises depositing the non-single crystalline material on the surface of the substrate using a deposition technique. In some embodiments, a non-single crystalline layer is deposited using a chemical vapor deposition (CVD) process, such as plasma enhanced CVD (PECVD), and a source gas or source gas mixture. Other methods of deposition of the non-single crystalline layer according to the present invention include, but are not limited to, physical vapor deposition, such as sputtering or vacuum evaporation. In other embodiments, a solid film of the non-single crystalline material may be laminated to a surface of the substrate, or the material may be printed on the substrate surface using a printing technology, such as inkjet printing, for example. The first layer is formed 110 with multiple crystallites of varying sizes, as defined above for the non-single crystalline material. A crystallite near the surface in the first layer provides a template for nucleating with a nanostructure.

Growing 120 a nanostructure on the first layer using catalyst-free epitaxial growth comprises controlling growth conditions of the nanostructure to form the nanostructure integral to a crystallite in the first layer. In some embodiments, controlling growth conditions comprises tuning growth temperature and gas composition. For example, if a source gas 'A' and a source gas 'B' are used to grow 'AB' nanostructures, the ratio of flow rates of the two gases is flow rate A/(flow rate A+flow rate B) in this example. In some embodiments, the nanostructures are grown 120 using vapor-phase epitaxy without a catalyst. In some embodiments, the epitaxial growth process is selective epitaxial growth. Certain catalyst materials, such as those comprising gold (Au), have deleterious effects on the reliability and performance of some semiconductor devices that comprise silicon. Attempts to remove the catalyst material from the nanostructure after catalytic growth or stray material on other surfaces are not always effective. Therefore, using a catalyst-free epitaxial growth process to form nanostructures is particularly attractive.

Catalyst-free epitaxial growth 120 is characterized as a nanometer-scale selective epitaxial growth process driven by the crystallite in the non-single crystalline material as a seed (i.e., grown integral to the crystallite). In some embodiments, the growth 120 is performed in a chemical vapor deposition (CVD) chamber in a controlled environment using a gas mixture comprising nanostructure source materials. During epitaxial growth 120, nanowires may grow along a certain preferential direction parallel to, for example, <111> crystal direction of respective crystallites in the first layer. The crystallites of the first layer are randomly oriented and are randomly located in the first layer. As such, nanowires will grow 120 in random directions from the first layer surface. Moreover, not all crystallites near the surface of the first layer will nucleate growth 120 of a nanostructure. As such, growth 120 of the nanostructure in any particular location on the surface of the first layer is also essentially random. For nanodots, the growth 120 is stopped almost immediately after it is started, in some embodiments. In other embodiments, the nanodots form 120 spontaneously on the first layer by so-called self-organized growth 120 driven by strain associated with the difference in lattice constants between the nanodots and the crystallites in the first layer.

In some embodiments, growing 120 a nanostructure comprises epitaxially growing a nanowire or a nanotube integral to the crystallite in the first layer using the catalyst-free epitaxial growth. In other embodiments, growing 120 a nanostructure comprises growing a nanodot integral to the crystallite in the first layer using the catalyst-free epitaxial growth. In still other embodiments, growing 120 a nanostructure comprises growing a nanodot integral to the crystallite in the first layer using the catalyst-free epitaxial growth; and further epitaxially growing a single crystalline nanowire from the nanodot. The grown nanodot provides a seed that facilitates the growth of the nanowire. The nanowire is effectively integral to the nanodot and the nanodot is integral to the first layer. The nanostructure effectively comprises both a nanodot and a nanowire.

In the embodiments of the nanostructure that comprises both a nanodot and a nanowire, the semiconductor material of the single crystalline nanodot may be the same as or different from the semiconductor material of the single crystalline nanowire, depending on the embodiment. Moreover, in some of these embodiments, the semiconductor material of the growing nanowire can be changed during growth such that the semiconductor material is different in segments along the axial length of the nanowire.

Figure 2:
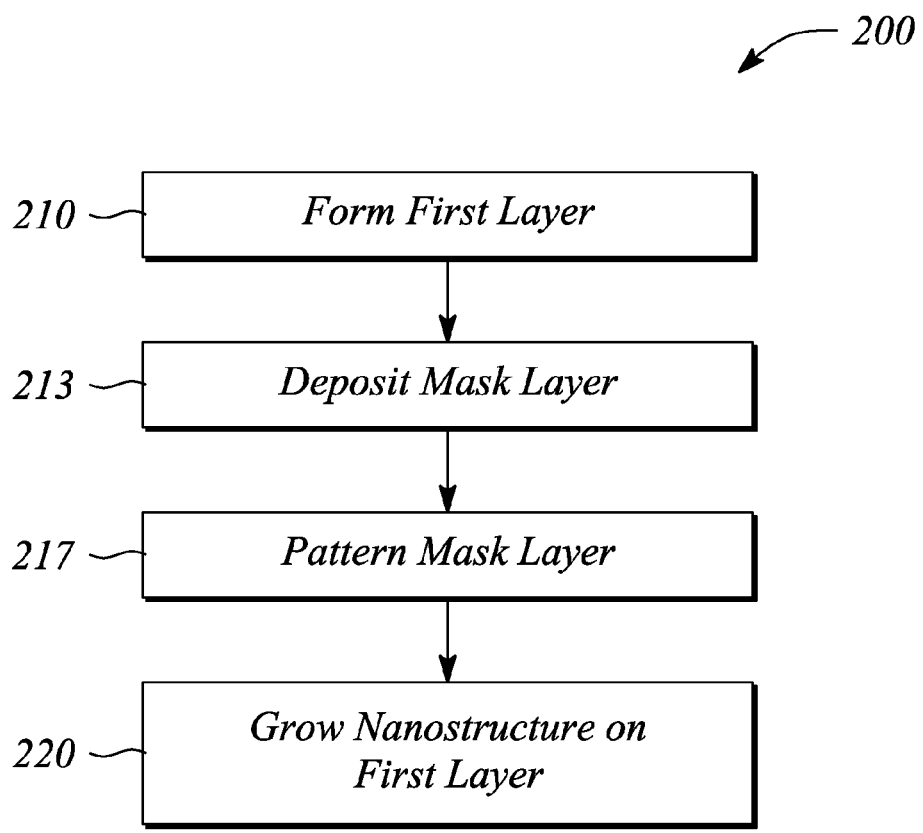
FIG. 2 illustrates a flow chart of a method of making a hetero-crystalline structure according to another embodiment of the present invention.

In another embodiment of the present invention, another method of making a hetero-crystalline structure is provided. FIG. 2 illustrates a flow chart of a method 200 of making a hetero-crystalline structure according to another embodiment of the present invention. The method 200 of making comprises forming 210 a first layer of a non-single crystalline material on a surface of a substrate. In some embodiments, the non-single crystalline material is a non-insulator material. In some embodiments, forming 210 a first layer is similar to the various embodiments of forming 110 a first layer described above for the method 100 of making a hetero-crystalline structure.

The method 200 of making a hetero-crystalline structure further comprises depositing 213 a mask layer on a surface of the first layer. In some embodiments, the mask layer is an insulator material selected from one of an oxide, a nitride and a carbide of a semiconductor material or a metal. Examples of insulator materials useful for the mask layer include, but are not limited to, silicon dioxide and titanium oxide. In other embodiments, the mask layer is an insulative polymer material that can withstand processing temperatures above 100° C. including, but not limited to, a polyimide.

The method 200 of making further comprises patterning 217 the mask layer to form an opening through a thickness of the mask layer that exposes a discrete portion of the first layer surface underneath. The opening corresponds to a crystallite at the surface of the first layer. In some embodiments, a plurality of openings is ultimately formed through the mask layer during patterning 217 that exposes a plurality of discrete portions of the first layer surface. In these embodiments, at least one of the openings corresponds to a crystallite at the surface of the first layer. By 'corresponds to', it is meant that either the crystallite or a portion of the crystallite is exposed by the opening, depending on the size of the crystallite. In some embodiments, at least one opening is smaller in size than a size of the crystallite exposed by the opening. In these embodiments, the smaller size of the opening reduces adverse effects associated with a lattice mismatch between a single crystalline structure of the nanostructure to be grown 220 and a crystalline structure of the crystallite. Effectively, the opening delineates a nanometer-scale size crystallite seed in the first layer for nanostructure growth 220, as described below, rendering use of a nanoparticle catalyst optional for the nanostructure growth 220.

The mask layer is patterned 217 using a variety of methods including, but not limited to, nanoimprint lithography (NIL), focused ion beam lithography, and electron beam lithography.

In nanoimprint lithography, a mold or patterning tool transfers a pattern to an imprintable surface of the mask layer through an imprinting process. In one example, the imprintable surface of the mask layer may be a material of the mask layer itself that is relatively softer than the mold, for example. In another example, the imprintable surface comprises a layer of a relatively softer material applied over the mask layer material, which is a relatively harder material. In either case, the relatively softer material receives and retains the imprinted pattern after the mold is removed and during further processing. A surface of the softer material that receives the mold during imprinting is referred to herein as the 'receiving surface' of the mask layer.

In some embodiments, the relatively softer material is cured or hardened during imprinting to facilitate retention of the imprinted pattern. Curing essentially 'freezes' or fixes the receiving surface in a shape or pattern determined by the mold. For example, a layer of a photo-curable material such as, but not limited to, a photo-activated monomer, oligomer, or polymer, (e.g., photoresist) that hardens when exposed to light (e.g., infrared, visible or ultraviolet (UV) illumination) may be used as the receiving surface. Prior to curing, the photo-curable material is soft (e.g., liquid or semi-liquid) and readily accepts the mold imprint pattern. Upon exposure to light, the photo-curable material cures around the mold. The cured photo-curable material thus retains the imprint pattern of the mold.

In another example, a thermoplastic material applied as a layer or film to a surface of the mask layer is used as the receiving surface. Prior to imprinting, the thermoplastic material layer is heated to about a glass transition temperature of the material, thereby softening the material. The mold is pressed into the softened material and the material is cooled to below the glass transition temperature causing the material to harden or cure around the impressed mold. The imprinted pattern is retained by the cured thermoplastic material. Examples of thermoplastic polymers that are used as the receiving layer include, but not limited to, polycarbonate, polymethylmethacrylate (PMMA) and methylmethacrylate (MMA).

The imprinted pattern in the soft material layer is then transferred into the mask layer as a positive image of the mold through lithography and etching, for example. The transferred pattern is further processed to form the openings in the mask layer that expose the discrete portions of the first layer surface. Such openings are typically nanometer-scale in size. The openings are formed using one or both of a dry etching technique, such as reactive ion etching (RIE) and plasma etching, and a wet chemical etching technique to selectively remove the mask layer material and form the openings through the thickness of the mask layer.

The method 200 of making a hetero-crystalline structure further comprises growing 220 a nanostructure on the first layer in the opening that was formed 217 through the mask layer. The grown 220 nanostructure is integral to a crystallite in the first layer surface that was exposed in the opening. In some embodiments, growing 220 a nanostructure is the same as growing 120 a nanostructure using catalyst-free epitaxial growth, as described above for the method 100 of making.

In other embodiments, the nanostructure is grown 220 using a catalyzed epitaxial growth process and nanoparticle catalyst in the opening of the mask layer. Techniques for catalyzed epitaxial growth include, but are not limited to, one of catalytic growth using vapor-liquid-solid (VLS) growth and catalytic growth using solution-liquid-solid (SLS) growth. Catalytic growth is further characterized by being either metal catalyzed or nonmetal catalyzed. Typical catalyst materials are metals and nonmetals. Metal catalyst materials include, but are not limited to, titanium (Ti), platinum (Pt), nickel (Ni), gold (Au), gallium (Ga), and alloys thereof. Non-metal catalyst materials include, but are not limited to, silicon oxide ($SiO_x$), where x ranges from about 1 to less than 2, for example. Typical nanoparticle catalysts corresponding to Ti and Au catalyst materials, for example, are respectively titanium silicide ($TiSi_2$) and gold-silicon (Au—Si) alloy.

Nanostructure growth 220 is initiated in a CVD reaction chamber using a gas mixture of a nanostructure source material that is introduced into the chamber at a growth temperature. In some embodiments, the exposed crystallite in the opening is used as a seed for growth. The nanostructure becomes integrated with the exposed crystallite during growth 220. In other embodiments, a nanoparticle catalyst is located in the opening on the exposed crystallite. The nanoparticle catalyst facilitates nanostructure growth 220 integral to the crystallite exposed in the opening. The nanoparticle catalyst remains on the tip or free end of the nanostructure after growth 220 until or unless it is removed.

In some embodiments, growing 220 comprise selective epitaxial growth. By definition, 'selective epitaxial growth' means that the single crystalline material grows epitaxially only on the exposed first layer, but does not grow or nucleate as a non-single crystalline species on the insulative mask layer. For example, selective epitaxial growth avoids deposition of a polycrystalline material on the insulative mask layer surface.

In some embodiments, the mask layer is deposited 213 to a targeted thickness, depending on the device structure application. In some embodiments, the nanostructure is grown 220 to extend vertically beyond the mask layer thickness. In other embodiments, the nanostructure is grown 220 to a length or height approximately equal to the mask layer thickness. In some embodiments, chemical mechanical polishing (CMP) may be used to render the nanostructure and the mask layer planar. An end surface of the nanostructure is exposed at a planar surface of the mask layer. In these embodiments, one or both of the mask layer and the nanostructure is planarized using CMP. In some embodiments, the surface of the mask layer may optionally be recessed slightly at the opening by selective chemical etching to expose more of the surface of the nanostructure near its exposed end for improved subsequent electrical connection, for example.

In some embodiments, the growth parameters of the nanostructure are controlled to adjust a shape of the nanostructure. For example, a nanowire can have a symmetrical columnar shape along the axial length of the nanowire. In another example, the nanowire can have an asymmetrical shape, such as a tapered or pyramidal shape, wherein the nanowire is wider at an end that is anchored to the first layer and is narrower at an opposite end. A taper angle is achieved by manipulating one or more of temperature, time, and a ratio of a nanowire source gas and a regulating gas in the source gas mixture. The regulating gas regulates growth rates on different crystallographic planes, which directly control the three dimensional feature of nanostructures.

In some embodiments, the selective epitaxial growth 220 facilitates forming a nanostructure that has an asymmetrical, 'T' cross-sectional shape. In these embodiments, a first portion of the nanostructure grows 220 vertically (i.e., vertical portion) as a single crystal in the opening of the mask layer. The nanostructure is effectively as wide as the opening is wide. A second portion of the nanostructure grows 220 laterally as a single crystal (i.e., lateral portion) on the mask layer continuous with the vertical portion. Such lateral growth is called 'lateral epitaxial overgrowth' (LEO) herein. In some embodiments, thermal CVD is used to selectively epitaxially grow 220 the nanostructure. The epitaxial semiconductor nanostructure is grown 220 in the opening to a thickness that exceeds a thickness of the mask layer. The selective epitaxial growth 220 continues laterally onto the mask layer surface as overgrowth (i.e., LEO) until a targeted dimension of the lateral portion of the so-called T shaped nanostructure is achieved.

In some embodiments, the method 200 of making further comprises doping one or both of the first layer and the nanostructure. In some embodiments, one or both of the first layer and the nanostructure independently is semiconductor material. In some of these embodiments, one or both of the first layer and the nanostructure are doped such that a p-n junction is formed in the hetero-crystalline device structure. In some embodiments, the p-n junction is any of the p-n junctions (including p-i-n junctions) described above. The dopant materials used and the dopant levels achieved are dependent on the hetero-crystalline semiconductor device application and not considered a limitation herein. In some embodiments, one of the first layer and the nanostructure is metal material or a metal alloy material and another of the first layer and the nanostructure is a semiconductor material. In some of these embodiments, the semiconductor material is doped to form a Schottky junction or an ohmic junction between the nanostructure and the first layer, as described above.

In some embodiments of the methods 100, 200 of making, the methods 100, 200 further comprises forming a second layer of either a non-single crystalline material or a single crystalline material, depending on the embodiment, such that the nanostructure is between the formed first layer and the second layer. Any of the materials mentioned above for the non-single crystalline material or the single crystalline material may be used for the second layer. In the method 200 of making, the non-single crystalline second layer is deposited on the mask layer after the nanostructure is grown 220. In the method 100 of making, the grown 120 nanostructure is embedded in an insulator layer using an insulator material, such as silicon dioxide for example, with an end surface of the nanostructure exposed at a surface of the insulator layer. The non-single crystalline second layer is deposited on the surface of the insulator layer in contact with the exposed end of the nanostructure. In some embodiments, the non-single crystalline second layer is a non-insulator material.

In other embodiments, a single crystalline second layer is formed using a wafer bonding technique. In some of these embodiments, the wafer bonding technique comprises mating a single crystalline second layer that is on a foreign substrate to either the insulator layer that embeds the grown 120 nanostructure, mentioned above for the method 100, or to the mask layer in the method 200. The single crystalline second layer is in contact with and effectively bonded to the respective mask or insulator layer and the nanostructures during mating. The wafer bonding technique further comprises removing the foreign substrate by etching, for example, such that the single crystalline second layer is exposed.

In some embodiments of the methods 100, 200 of making, the methods 100, 200 further comprise forming an electrical connection to electrically access one or more of the first layer, the nanostructure, and the second layer, when present. The electrical connection is formed using a deposition method and either a conductive metal material or a semiconductor material having a targeted doping level. For example, deposition methods including, but not limited to, sputtering and evaporation may be used. In some embodiments, electrical contacts are formed that separately interface to the first layer and the nanostructure, or the first layer and the second layer, when present.

Figure 3:
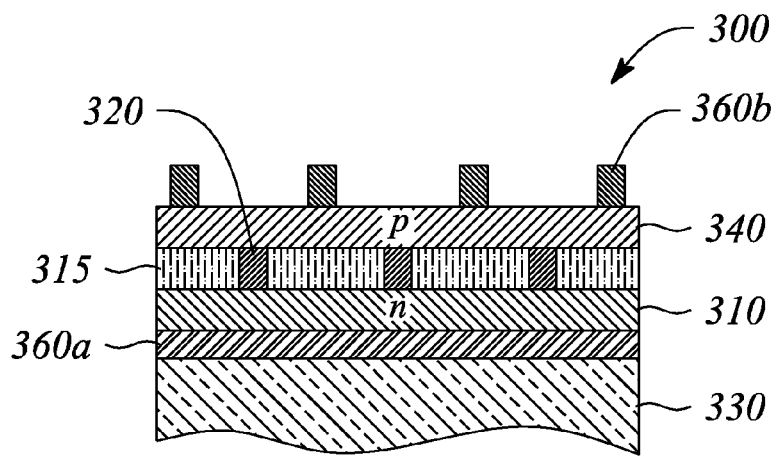
FIG. 3 illustrates a side view of a hetero-crystalline device structure according to an embodiment of the present invention.

In another embodiments of the present invention, a hetero-crystalline device structure is provided. FIG. 3 illustrates a side view of a hetero-crystalline structure 300 according to an embodiment of the present invention. The hetero-crystalline structure 300 comprises a first layer 310 that is non-single crystalline material and a nanostructure 320 that is a single crystalline material.

The nanostructure 320 comprises one or more of nanowires, nanodots and nanotubes. In FIG. 3, a plurality of the nanostructures 320 is illustrated by way of example. Hereinafter, the nanostructures 320 in FIG. 3 may be referred to as just 'nanowires 320', for simplicity of discussion and not by way of limitation.

The nanostructure 320 is integral to a crystallite in the first layer 310. As discussed above, by 'integral to', it is meant that the crystallite of the first layer 310 and the single crystalline nanostructure 320 form an interface where the lattice of the nanostructure 320 is coherent with the lattice of the crystallite. The crystallite provides a nucleation site for the epitaxial growth of the single crystalline nanostructure 320 during manufacturing of the hetero-crystalline structure 300. As such, the nanostructure 320 is at least physically anchored to the crystallite of the first layer 310. In some embodiments, the hetero-crystalline structure 300 illustrated in FIG. 3 is manufactured using the fabrication method 100 of FIG. 1, described above. In other embodiments, the hetero-crystalline structure 300 illustrated in FIG. 3 is manufactured using the fabrication method 200 of FIG. 2, as described above.

In some embodiments, the hetero-crystalline structure 300 further comprises a substrate 330, as illustrated in FIG. 3. The substrate 330 is adjacent to the first layer 310. In some embodiments, the function of the substrate 330 is to provide mechanical support to the first layer 310. In other embodiments, the substrate 330 may provide addition functionality including, but not limited to, an electrical interface to the hetero-crystalline semiconductor device 300. In general, a broad range of materials are useful as the substrate 330 for the hetero-crystalline device structure 300 of the various embodiments herein.

For example, the material of the substrate 330 includes, but is not limited to, a glass, a ceramic, metal, a plastic, a polymer, a dielectric, a semiconductor and a combination of any of these materials. A semiconductor substrate material includes materials that have one of no crystallographic structure (e.g., amorphous), a non-single crystalline structure (i.e., having crystallites) and a single crystalline structure. In some embodiments, the substrate material is chosen at least for its ability to withstand manufacturing temperatures at or above about 100 degrees centigrade (° C.). In various embodiments, the substrate 330 may be one of rigid, semi-rigid and flexible, depending on specific applications of the hetero-crystalline device structure 300. Moreover, the substrate 330 may be one of opaque, transparent and semi-transparent to electromagnetic radiation in one or more of visible, ultra-violet (UV) and infra-red (IR) spectrums, depending on various embodiments of the present invention.

In some embodiments, the hetero-crystalline device structure 300 further comprises a second layer 340 that is either a non-single crystalline material or a single crystalline material, depending on the embodiment or the application of the device structure. The second layer 340 is located such that the nanostructure 320 is located between the first layer 310 and the second layer 340 according to various embodiments.

As illustrated in FIG. 3, the second layer 340 is located in a vertically stacked relationship with the first layer 310 and an insulator layer 315 that comprises the nanostructure 320. In some embodiments, the nanostructure 320 is embedded in an insulator layer 315 in that the nanostructure extends through a thickness of the insulator layer 315 from the first layer 310 to the second layer 340. In these embodiments, an end of the nanostructure 320 that is adjacent to the second layer 340 is in contact with the second layer 340. In some embodiments, the insulator layer 315 is the mask layer that is deposited 213 and patterned 217 according to the method 200 of making described above. In some embodiments, the insulator layer 315 comprises an insulator material including, but not limited to, one of an oxide, a nitride and a carbide of a semiconductor material or a metal material. In some embodiments, the insulator layer 315 is an insulator material that includes, but is not limited to, a polymer that can withstand device processing temperatures above about 100° C. For example, the polymer insulator material may be polyimide. In some embodiments, the insulator layer 315 is one of transparent and semi-transparent to electromagnetic radiation in one or more of visible, UV and IR spectrums.

In some embodiments, the non-single crystalline material of the first layer 310 and the second layer 340 are independently any of the non-single crystalline materials described above. In some embodiments, the non-single crystalline material of the first layer 310 is a non-insulator material. In some embodiments, the second layer 340 is a single crystalline material including any of the materials described above for single crystalline materials. When one or both of the first and second layers 310, 340 are semiconductor materials, the layer may be doped to provide a junction or a targeted level of electrically conductivity to the hetero-crystalline device structure 300. For example, the first layer 310 may comprise silicon (Si) in a non-single crystalline film while the second layer 340 may comprise germanium (Ge) or gallium arsenide (GaAs) in a non-single crystalline film. In another example, the first layer 310 may comprise a hydrogenated silicon (Si:H) non-single crystalline film while the second layer 340 comprises non-single crystalline silicon (Si).

In other embodiments, the non-single crystalline material of one or both of the first and second layers 310, 340 independently is a metal, metal alloy or metal compound. For example, the non-single crystalline metal material may be titanium (Ti), nickel (Ni). In another example, the non-single crystalline metal alloy material may be stainless steel or brass. As such, the non-single crystalline materials of the first layer 310 may be the same as or different from the non-single crystalline material of the second layer 340. Moreover, when the non-single crystalline material of the first layer 310 and the second layer 340 are the same material, the crystalline structure of the crystallites in the material of the first layer 310 independently may be comparable to or dissimilar from the crystalline structure of the crystallites of the material of the second layer 340.

The single crystalline material of the nanostructure 320 is any of the materials described above for the single crystalline material, including a non-linear optical material. When the nanostructure 320 is a semiconductor material, the nanostructure 320 may be selectively doped for an intended application. When one or both of the first layer 310 and the second layer 340 are semiconductor materials and the nanostructure 320 is also a semiconductor material, the semiconductor material of the nanostructure 320 may be the same as or different from the respective semiconductor material of one or both of the first layer 310 and the second layer 340. The same is applicable to when one or both of the layer 310, 340 and the nanostructure 320 are respective electrical conductor materials or respective insulator materials. However, the nanostructure 320 is a single crystalline material and the first layer 310 is a non-single crystalline material in accordance with the embodiments herein. For example, the semiconductor material of the first layer 310, the nanostructures 320 and the second layer 340, may each be silicon. In another example, the semiconductor material of the first layer 310 may be Si:H, the semiconductor material of the nanostructures 320 may be indium phosphide (InP), and the semiconductor material of the second layer 340 may be Si.

In some embodiments, concomitant with a choice of the semiconductor materials independently used in the first layer 310, the nanostructure 320 and the second layer 340 is a respective energy band gap of the respective semiconductor layers 310, 340 and nanostructure 320. In some embodiments of the hetero-crystalline device structure 300, the energy band gap of the nanostructure 320 is different from the energy band gap of one or both of the first layer 310 and the second layer 340. In some embodiments, the energy band gap of the first layer 310 is different from the energy band gap of the second layer 340. In other embodiments, the energy band gaps of the first layer 310 and the second layer 340 are the same. Using materials with different energy band gaps makes the hetero-crystalline device structure 300 a heterostructure.

For example, in one or more of a solar cell application, an LED application, a laser application and a photodetector application, the energy band gap of the nanostructure 320 may be less than the energy band gaps of both the first and second layers 310, 340 (i.e., a 'high-low-high' band gap heterostructure) of the hetero-crystalline semiconductor device 300. In solar cell applications, for example, such a high-low-high heterostructure may enhance the performance of the device by improving an efficiency of ionizing photo-generated electron-hole pairs. In another example, a low-high-low band gap heterostructure may be used for resonant tunneling diode applications. In particular, in such applications, the energy band gap of the nanostructure 320 may be greater than the energy band gaps of both the first layer 310 and the second layer 340 (i.e., the 'low-high-low' band gap heterostructure).

In some embodiments, the hetero-crystalline structure 300 further comprises an electrical connection to separately electrically access one or more of the first layer 310, the second layer 340 and the nanostructure 320. FIG. 3 illustrates an electrical contact 360a between the first layer 310 and the substrate 330 and an electrical contact 360b on the second layer 340, for example. The nanostructures 320 are electrically accessible in conjunction with the first and second layers 310, 340 by the first and second electrical contacts 360a, 360b.

The electrical contacts 360a, 360b are made from a material that includes, but is not limited to, a metal, a metal alloy and a semiconductor material that is doped to provide a targeted level of electrical conductivity for the application of the hetero-crystalline device structure 300. In some embodiments, the material of the electrical contacts 360a, 360b is either transparent or semi-transparent to electromagnetic radiation in one or more of visible, UV and IR spectrums.

In some embodiments, the hetero-crystalline device structure may be a multilayer device structure that comprises multiple alternating layers of non-single crystalline materials and single crystalline nanostructures. In some embodiments, the device structure is a laterally adjacent multilayer. In other embodiments, the device structure is a vertically stacked multilayer.

Figure 4A:
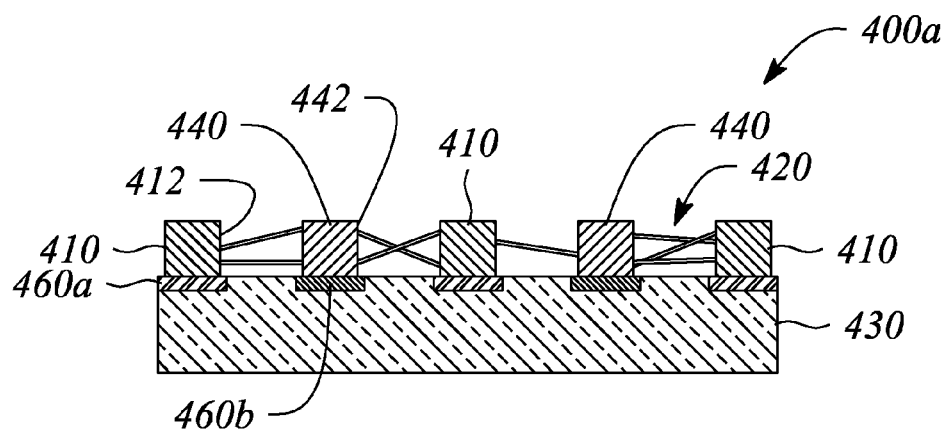
FIG. 4A illustrates a side view of a hetero-crystalline device structure having laterally adjacent crystalline structures according to another embodiment of the present invention.

FIG. 4A illustrates a hetero-crystalline device structure 400a having laterally adjacent crystalline structures according to an embodiment of the present invention. First layers 410 of non-single crystalline material as well as second layers 440 of non-single crystalline material alternate on the surface of the substrate 430 in spaced apart, discrete segments, each having opposing vertical sidewalls. A plurality of nanostructures 420 extend laterally from a respective vertical sidewall 412, 442 of one or both of the first layer 410 segments and the second layer 440 segments to an opposing vertical sidewall of an adjacent segment. The nanostructures 420 are grown from and are integral to one or both of a crystallite in the first layer 410 and a crystallite in the second layer 440, depending on the embodiment. On or within the substrate 430 are a plurality of spaced apart electrical contacts 460a, 460b corresponding to the first layers 410 and the second layers 440, respectively, that provide electrical access to the nanostructures 420 therebetween. In some embodiments, the hetero-crystalline device structure 400a is manufactured using either of the methods 100, 200 of making described herein.

Figure 4B:
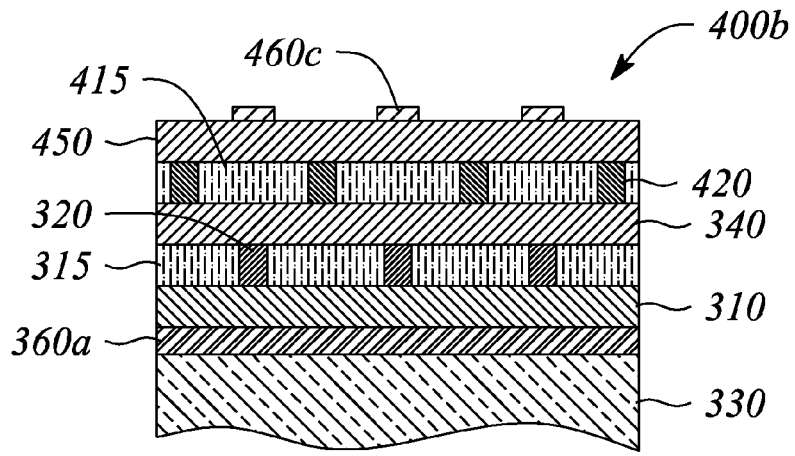
FIG. 4B illustrates a side view of a hetero-crystalline device structure having a vertically stacked multilayer structure according to another embodiment of the present invention.

FIG. 4B illustrates a hetero-crystalline device structure 400b having a vertically stacked multilayer structure according to an embodiment of the present invention. The hetero-crystalline device structure 400b is similar to the basic structure of the hetero-crystalline device structure 300 in FIG. 3. However, the hetero-crystalline device structure 400b further comprises a nanostructure 420 integral to a crystallite in the second layer 340a. The nanostructure 420 independently may be any of the single crystalline materials described above. In some embodiments, the hetero-crystalline device structure 400b further comprises an insulator layer 415 that is similar to either the mask layer 315 or the insulator layer 315, described above; and a third layer 450 of either a non-single crystalline material or a single crystalline material on the insulator layer 415 that is in contact with the nanostructure 420, for example, similarly to the contact between the second layer 340 and the nanostructures 320. The crystalline material of third layer 450 may be any of the non-single crystalline materials or single crystalline materials described above. In some embodiments, the hetero-crystalline device structure 400b further comprises an electrical contact 460c located on the third layer 450 for accessing the nanostructures 420. In some embodiments, the electrical contact 460c is similar to either of the electrical contact 360a or 360b. In some embodiments, the hetero-crystalline device structure 400b is manufactured using either of the methods 100, 200 of making described herein.

According to some embodiments, the material of one or more of the non-single crystalline layers and the nanostructures of the hetero-crystalline device structure 300, 400a. 400b is a semiconductor material that is doped with a dopant material. The dopant material provides a targeted level of electrical conductivity to the nanostructure and the respective layers, when they are semiconductor material layers. In some embodiments, the dopant material is used to provide a junction in the hetero-crystalline device structure 300, 400a. 400b. For example, in each of a solar cell application, an LED application, a laser application and a photodetector application, the hetero-crystalline device structure may comprise a p-n junction. In some embodiments, the hetero-crystalline device structure 300, 400a, 400b may comprise one or more of a p-n junction, a Schottky junction and an ohmic junction, as described above. For example, the respective junction is located one or more of in the nanostructure 320, 420, in a respective layer 310, 340, 450, between the nanostructure 320 and the first layer 310, between the first layer 310 and the second layer 340, between the nanostructure 320 and the second layer 340, between the second layer 340 and the nanostructure 420, between the second layer 340 and the third layer 450, and between the nanostructure 420 and the third layer 450, depending on the materials used for the layers and the nanostructures.

Thus, there have been described various embodiments of a method of making a hetero-crystalline structure and a hetero-crystalline device structure. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A hetero-crystalline structure comprising:
   a first layer of a non-single crystalline material having short range atomic ordering;
   a nanostructure of a single crystalline material on the first layer, the nanostructure being integral to a crystallite in the first layer; and
   a layer of an insulator material on a surface of the first layer, the nanostructure being located in an opening through a thickness of the insulator material layer.

2. The hetero-crystalline structure of claim 1, wherein the non-single crystalline material of the first layer is a non-insulator material, the nanostructure comprising one or both of a nanodot and a nanowire.

3. The hetero-crystalline structure of claim 1, further comprising:
   a second layer of a non-single crystalline material on the insulator layer, the second layer being in contact with the nanostructure;
   electrical contacts interfaced to the first layer and the second layer, the nanostructure being electrically accessible by the electrical contacts; and
   one or more of a p-n junction, a Schottky junction and an ohmic junction located one or more of in the first layer, in the second layer, in the nanostructure, between the first layer and the nanostructure, and between the second layer and the nanostructure.

4. The hetero-crystalline structure of claim 3, wherein the first layer, the nanostructure, and the second layer each independently comprise a semiconductor material, each semiconductor material having an energy band gap.

5. The hetero-crystalline structure of claim 4, wherein the energy band gap of the nanostructure is different from the energy band gap of one or both of the first layer and the second layer.

6. The hetero-crystalline structure of claim 5, wherein the energy band gap of the nanostructure is less than the energy band gaps of both the first layer and the second layer.

7. The hetero-crystalline structure of claim 5, wherein the energy band gap of the nanostructure is greater than the energy band gaps of both the first layer and the second layer.

8. The hetero-crystalline structure of claim 4, wherein the energy band gap of the first layer is different from the energy band gap of the second layer.

9. The hetero-crystalline structure of claim 4, wherein the energy band gap of the first layer is the same as the energy band gap of the second layer.

10. The hetero-crystalline structure of claim 1, wherein the nanostructure comprises at least one of a nanowire, a nanotube, and a nanodot.

11. The hetero-crystalline structure of claim 1, wherein a substrate is adjacent to the first layer and provides at least one of mechanical support to the first layer and an electrical interface to the first layer.

12. A hetero-crystalline structure comprising:
a first layer of a non-single crystalline material;
a nanostructure of a single crystalline material on the first layer, the nanostructure being integral to a crystallite in the first layer;
an insulator layer that surrounds the nanostructure;
a second layer of a non-single crystalline material on the insulator layer, the second layer being in contact with the nanostructure;
electrical contacts interfaced to the first layer and the second layer, the nanostructure being electrically accessible by the electrical contacts; and
one or more of a p-n junction, a Schottky junction and an ohmic junction located one or more of in the first layer, in the second layer, in the nanostructure, between the first layer and the nanostructure, and between the second layer and the nanostructure.

13. The hetero-crystalline structure of claim 12, wherein an energy band gap of the nanostructure is different from an energy band gap of one or both of the first layer and the second layer.

14. The hetero-crystalline structure of claim 12, wherein an energy band gap of the first layer is different from an energy band gap of the second layer.

15. The hetero-crystalline structure of claim 12, wherein the non-single crystalline material of the first layer is a non-insulator material.

16. The hetero-crystalline structure of claim 12, wherein the nanostructure comprises at least one of a nanowire, a nanotube, and a nanodot.

17. The hetero-crystalline structure of claim 12, further comprising a substrate adjacent to the first layer that provides mechanical support to the first layer.

18. The hetero-crystalline structure of claim 12, further comprising a substrate adjacent to the first layer that provides the electrical contact interface to the first layer.

19. A hetero-crystalline structure comprising:
a first layer of a non-single crystalline semiconductor material having short range atomic order;
a nanostructure of a single crystalline semiconductor material on the first layer, the nanostructure being integral to a crystallite in the first layer, the nanostructure having a different energy band gap than an energy band gap of the first layer;
an insulator layer that surrounds the nanostructure;
a second layer of a non-single crystalline material on the insulator layer, the second layer being in contact with the nanostructure, the nanostructure being electrically accessible from one or both of the first layer and the second layer; and
one or more of a p-n junction, a Schottky junction and an ohmic junction located one or more of in the first layer, in the second layer, in the nanostructure, between the first layer and the nanostructure, and between the second layer and the nanostructure.

* * * * *